(12) United States Patent
Medasani et al.

(10) Patent No.: US 7,761,389 B2
(45) Date of Patent: Jul. 20, 2010

(54) METHOD FOR ANOMALY PREDICTION OF BATTERY PARASITIC LOAD

(75) Inventors: Swarup Medasani, Thousand Oaks, CA (US); Qin Jiang, Woodland Hills, CA (US); Narayan Srinivasa, Oak Park, CA (US); Yilu Zhang, Northville, MI (US); Leandro G. Barajas, Troy, MI (US); Nick S. Kapsokavathis, Shelby Township, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 537 days.

(21) Appl. No.: 11/843,876

(22) Filed: Aug. 23, 2007

(65) Prior Publication Data
US 2009/0055330 A1  Feb. 26, 2009

(51) Int. Cl.
  G06F 15/18 (2006.01)
  G06N 7/02 (2006.01)
(52) U.S. Cl. .................. 706/2; 706/1; 706/12; 706/15; 706/20; 706/21
(58) Field of Classification Search ...................... 706/2
  See application file for complete search history.

(56) References Cited

U.S. PATENT DOCUMENTS 6,094,617 A * 7/2000 Lapke ........................ 701/104
7,184,284 B2 * 2/2007 Yan .............................. 363/59
7,310,252 B2 * 12/2007 Yan .............................. 363/59

FOREIGN PATENT DOCUMENTS

| JP | 07-098367 A | 4/1995 |
| JP | 13-272444 A | 10/2001 |
| KR | 10-1997-0002337 A | 1/1997 |

OTHER PUBLICATIONS

Modeling and Prediction of Distribution System Voltage Distortion Caused by Nonlinear Residential Loads, Wang, Y. J.; O'Connell, R. M.; Brownfield, G.; Power Engineering Review, IEEE vol. 21 , Issue: 7 Digital Object Identifier: 10.1109/MPER.2001.4311492 Publication Year: 2001 , pp. 71-71.*

Prediction of parasitic components in an automotive environment, Alexandersson, S.; Alakula, M.; Bangtsson, H.; Electromagnetic Compatibility, 2008. EMC 2008. IEEE International Symposium on Digital Object Identifier: 10.1109/ISEMC.2008.4652036 Publication Year: 2008 , pp. 1-7.*

(Continued)

*Primary Examiner*—Michael Holmes

(57) ABSTRACT

Anomaly prediction of battery parasitic load includes processing input data related to a state of charge for a battery and a durational factor utilizing a machine learning algorithm and generating a predicted start-up state of charge. Warnings are issued if the predicted start-up state of charge drops below a threshold level within an operational time.

21 Claims, 5 Drawing Sheets

OTHER PUBLICATIONS

An analytical high-level battery model for use in energy management of portable electronic systems, Rakhmatov, D.N.; Vrudhula, S.B.K.; Computer Aided Design, 2001. ICCAD 2001. IEEE/ACM International Conference on Digital Object Identifier: 10.1109/ICCAD.2001.968687 Publication Year: 2001, pp. 488-493.*

Keep on running: predicting battery performance by cell approach, Clegg, A.S.; Telecommunications Energy Conference, 1992. INTELEC '92., 14th International Digital Object Identifier: 10.1109/INTLEC.1992.268409 Publication Year: 1992, pp. 418-423.*

D. Chelidze, Multimode Damage Tracking and Failure Prognosis in Electromechanical System.

H. Funato, New Estimation Method of State of Batteries Based in System Identification, Proceedings of SDEMPED 2003, Symposium on Diagnostics for Electric Machines, Power Electronics and Drives, pp. 345-348, 2003.

O. Bohlen, Impedance Based Battery Diagnosis for Automotive Applications, University of Technology Aachen, Aachen, Germany and others, Power Electronics Specialists Conference, PESC 04.2004 IEEE 35th Annual, vol. 4, pp. 2792-2797, 2004.

J.D. Kozlowski, Prediction Methods and Data Fusion for Prognostics of Primary and Second Batteries, Applied Research Laboratory, The Pennsylvania State University and others.

J. D. Kozlowski, Model-based Predictive Diagnostics for Electrochemical Energy Sources, Applied Research Laboratory, The Pennsylvania State University, State College, PA, USA, Proceedings of IEEE Aerospace Conference, pp. 6-3149-6-3163, 2001.

E. I. Noviello, Battery Diagnostics and Performance Prediction: Computation vs. Expert System Based Approach, Telecommunications Energy Conference, INTELEC '93, 15th International, vol. 1, pp. 460-466, Sep. 27-30, 1993.

P. Singh, Fuzzy Logic-Based State-of-Heath Determination of Lead Acid Battery, Telecommunications Energy Conference, INTELEC, 24th Annual International, pp. 583-590, 2002.

S. Deshpande, Intelligent Monitoring System Satisfies Customer Needs for Continuous Monitoring and Assurance on VRLA Batteries, Telecommunications Energy Conference, INTELEC '99, the 21st International, pp. 7, Jun. 6-9, 1999.

D.C. Cox, Battery State of Health Monitoring, Combining Conductance Technology with Other Measurement Parameters for Real-Time Battery Performance Analysis, Telecommunications Energy Conference, INTELEC, Twenty-Second International, pp. 342-347, 2000.

B. P. Gollomp, Intelligent Battery Analyzer/Charger Systems, Knowledge Discovery and Data Mining, Allied-Signal Aerospace Company Teterboro, NJ, USA.

R. S. Robinson, On-Line Battery Testing: a Reliable Method for Determining Battery Health?, Telecommunications Energy Conference, INTELEC '96, 18th International, pp. 654-661, Oct. 6-10, 1996.

P. Waltari, Survey and Evaluation of Battery Monitoring Methods and Results from User's Viewpoint, Telecommunications Energy Conference, INTELEC '99, the 21st International, pp: 7, Jun. 6-9, 1999.

M. B. House, Probabilistic Life Forecasting of Electric Motors and Driven Equipment, Proceedings of the 57th MFPT Meeting, 2003.

S. Mishra, Life Consumption Monitoring for Electronics Prognostics, Proceeding of IEEE Aerospace Conference, vol. 5, pp. 3455-3467, 2004.

J. Luo, Model-based Prognostic Techniques, AUTOTESTCON 2003, IEEE Systems Readiness Technology Conference Proceedings, pp. 330-340, 2003.

W. Wang, Toward Dynamic Model-Based Prognostics for Transmission Gears, Proceedings of SPIE vol. 4733, Component and System Diagnostics, Prognostics, and Health Management II, pp. 157-167, 2002.

C. Wilkinson, Prognostic and Health Management for Avionics, IEEE Aerospace Conference Proceeding, pp. 3435-3447, 2004.

V. A. Skormin, Data Mining Technology for Failure Prognostics of Avionics, IEEE Transactions on Aerospace and Electronic Systems, vol. 38, Issue: 2, Apr. 2002, pp. 388-403, 2002.

C. S. Byingtom, Embedded Diagnostic/Prognostic Reasoning and Information Continuity for Improved Avionics Maintenance, Proceedings of IEEE Aerospace Conference, pp. 3424-4334, 2004.

C. S. Byingtom, Advanced Diagnostic/Prognostic Reasoning and Evidence Transformation Techniques for Improved Avionics Maintenance, AUTOTESTCON 2003, IEEE Systems Readiness, Technology Conference Proceedings, pp. 320-329, 2003.

M. E. Nieto, Naval Aviation Aging Wiring: Prognostic and Diagnostic Solutions, Thesis, Naval Postgraduate School, Monterey, California, USA 2000.

C. Teal, Technology Update I: Wiring Prognostic Tools, DASC'03 Proceedings, Digital Avionics System Conference, vol. 1, pp. 11.E.1-1-11.E.1-7, 2003.

C. Teal, Technology Update II: Wire Systems Diagnostics & Prognostics, DASC'03 Proceedings, Digital Avionics System Conference, vol. 2, pp. 11.E.2-1-11.E.2-9, 2003.

G. Vachtsevanos, Fault Prognosis using Dynamic Wavelet Neural Network, AUTOTESTCON Proceedings, 2001, IEEE Systems Readiness Technology Conference, Aug. 20-23, 2001, pp. 857-870, 2001.

E. Phelps, A Statistical Approach to Prognostics, The Proceedings of SPIE, vol. 4389, pp. 23-34, 2001.

R. B. Chinnam, Autonomous Diagnostics and Prognostics through Competitive Learning Driven HMM-Based Clustering, The Proceedings of the International Joint Conference on Neural Networks, vol. 4, pp. 2466-2471, 2003.

D. C. Swanson, A General Prognostic Tracking Algorithm for Predictive Maintenance, Proceedings of IEEE Aerospace Conference, pp. 6-2971-6-2976, 2000.

C. Kwan, A Novel Approach to Fault Diagnostics and Prognostics, Proceedings of IEEE International Conference on Robotics & Automation, pp. 604-609, 2003.

L. P. Su, Prognostic Framework, AUTOTESTCON Proceedings, IEEE System Readiness Technology Conference, pp. 661-672, 1999.

L. P. Su, Prognostic Framework—Update II, AUTOTESTCON Proceedings, IEEE System Readiness Technology Conference, pp. 497-504, 2000.

S. J. Engle, Prognostics, the Real Issues Involved with Predicting Life Remaining, IEEE Aerospace Conference Proceeding, pp. 457-465, 2000.

N. K. Kasaboy and Q. Song, DENFIS: Dynamic Evolving Neural-Fuzzy Inference System and Its Application for Time-Series Prediction, IEEE Trans. on Fuzzy Systems, vol. 10, No. 2, pp. 144-154, 2002.

J. T. G. Hwang and A. A. Ding, Prediction Intervals for Artificial Neural Networks, Journal of the American Statistical Association, vol. 92, No. 438, pp. 748-757, Jun. 1997.

S. L. Ho, M. Xie, L. C. Tang, K. Xu, and T. N. Goh, Neural Network Modeling with Confidence Bounds: A Case Study on Solder Paste Deposition Process, IEEE Trans, On Electronics Packaging Manufacturing, vol. 24, No. 4, pp. 323-332, Oct. 2001.

* cited by examiner

METHOD FOR ANOMALY PREDICTION OF BATTERY PARASITIC LOAD

TECHNICAL FIELD

This disclosure is related to a battery monitoring system.

BACKGROUND

It is known to monitor battery state of charge during periods of shut-down and to use the monitored state of charge to prevent battery depletion before the next start-up event. Although this start-up function may be the primary function of a battery, batteries are also used to power auxiliary systems during periods of shut-down or park cycles. These auxiliary power drains are parasitic loads upon the battery. A monitoring system may be utilized during park cycles to sample the state of charge available from the battery at periodic intervals. This state of charge may then be compared to some threshold state of charge value to determine whether the battery has lost enough charge to pose a risk to the next start-up event. However, known sampling and comparison methods may be inaccurate or slow to indicate abnormal conditions. One factor in slow indications is the long periods that tend to exist between actual state of charge sampling events. Measuring actual state of charge is an operation that in itself depletes some battery charge. It is undesirable that the very system meant to warn of low battery charge be a primary contributor to the battery drain.

It is desirable to generate from available sensor readings a predicted start-up state of charge that can be utilized to forecast anomalous situations in which the next start-up cycle is at risk due to excessive battery parasitic load.

SUMMARY

A method for anomaly prediction of battery parasitic load including processing input data related to a state of charge for a battery and a durational factor, wherein the processing utilizes a machine learning algorithm and generates a predicted start-up state of charge. The method further includes indicating a warning if the predicted start-up state of charge forecasts the state of charge of the battery dropping below a threshold level within an operational time.

BRIEF DESCRIPTION OF THE DRAWINGS

One or more embodiments will now be described, by way of example, with reference to the accompanying drawings, in which.

DETAILED DESCRIPTION

Figure 1:
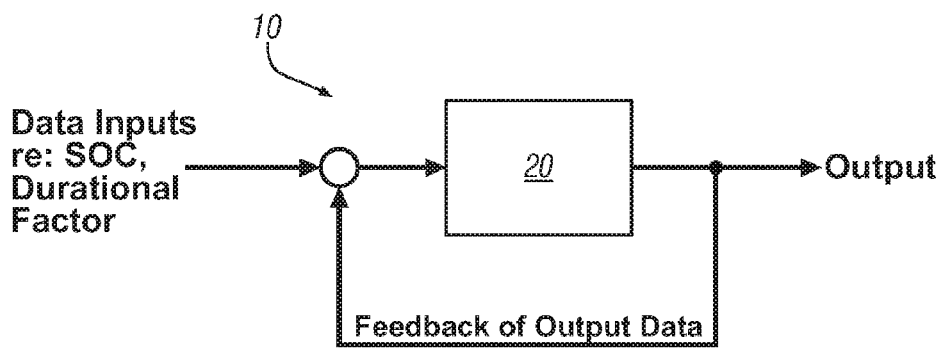
FIG. 1 is a schematic diagram exemplifying an embodiment of an automatic control system in accordance with the present disclosure.

Referring now to the drawings, wherein the showings are for the purpose of illustrating the disclosure only and not for the purpose of limiting the same, FIG. 1 schematically illustrates a feedback mechanism utilizing data inputs to develop an output and subsequently feeding this output back through the mechanism as an additional input in order to reduce prediction errors in the mechanism, in accordance with an exemplary embodiment of the present disclosure. In particular, this illustration demonstrates the usage of an automatic control system 20 within a state of charge prediction system 10. Data inputs relating to a state of charge ("SOC") at a given time and a durational factor describing the time span elapsed since the state of charge was determined are fed to automatic control system 20, which applies functions and modifiers to the data inputs in order to generate a desired output operable to predict battery SOC as a function of the durational factor. This output may be utilized in any number of ways to evaluate and predict the effect of parasitic loads upon SOC. The output is additionally routed back through automatic control system 20 for purposes of correcting any prediction errors within the output.

Figure 2:
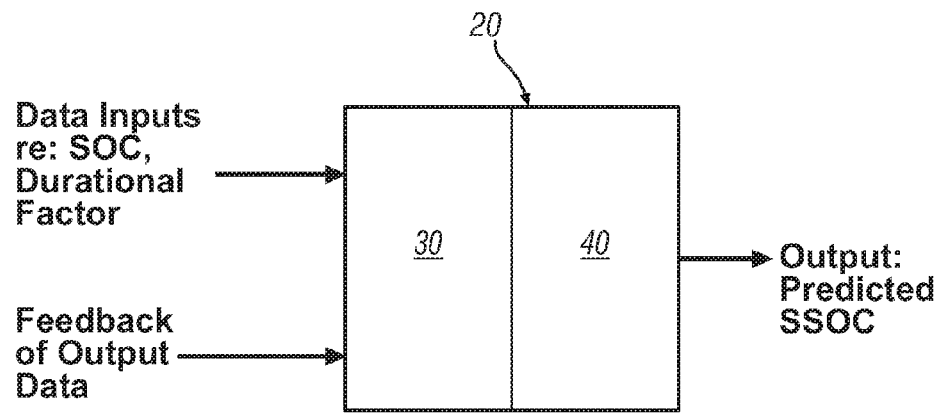
FIG. 2 is a schematic diagram exemplifying an embodiment showing in more detail an exemplary form that an automatic control system may take in accordance with the present disclosure.

The embodiment shown in FIG. 2 graphically illustrates in more detail an exemplary form that automatic control system 20 may take. Automatic control system 20 acts as a functional operator, converting inputs into a desired output. Automatic control system 20 may be broken down into a mapping function 40, the unit which directly applies the functional operation to the data inputs, and input layer 30. Input layer 30 may serve several roles, included but not limited to simply routing the data inputs through to mapping function 40, filtering the data inputs with any number of biases, applying heuristic techniques to the data to smooth out any inconsistent readings, or even applying substantive data processing techniques, these techniques being operative to improve the accuracy of the mapping function to be applied later. In preferred embodiments, these data processing techniques may take the form of applying fuzzy logic, as will be discussed in greater detail herein. Mapping function 40 accepts data inputs and performs any number of sub-algorithms in order to generate an output, a prediction function describing what SOC should be available to initiate a start-up event at any given time span from the last key-off event. Mapping function 40 may take many forms, including simple fixed functions, a plurality of fixed functions utilized on the basis of the output of input layer 30, or more complex means of processing the data inputs. The prediction output generated by mapping function 40, the predicted start-up SOC ("predicted SSOC"), enables prognostic and diagnostic analyses to be performed in order to estimate the effects of parasitic loads upon SOC. The purpose of this estimation is to ensure that the battery maintains an adequate SOC to protect the next start-up event by warning the operator or taking other action in time to prevent the SOC from falling below some critical SOC level.

Batteries are frequently used as a store of energy to provide power to a starter motor as part of a start-up cycle for an internal combustion engine, for instance in a motor vehicle. In the event that the batteries have enough charge to power the starter motor, a voltage is supplied to the starter motor, the engine starts, and energy subsequently flows back from an engine/generator complement to replenish the energy depleted during start-up. A critical SOC level may be defined, below which a battery may no longer be capable of supplying enough energy to accomplish a start-up event. While the storage and selective transfer of energy for start-up is the primary function of the battery, batteries are widely used as a source of energy for auxiliary devices that require power during park cycles. These auxiliary devices cause varying degrees of drain or parasitic load on the battery.

Most batteries are designed to tolerate some level of parasitic loading without jeopardizing the primary start-up function. However, parasitic loads may be abnormally applied, for instance if a door is left ajar, or may combine to overwhelm the battery to a degree that the subsequent start-up event is at risk due to low state of charge. In addition, some batteries are not designed to operate under deep-cycle conditions; even though the battery may maintain the ability to support start-up functions in the short term, the overall life span of the battery may be shortened if too much charge is taken from the battery on a recurring basis.

Figure 3:
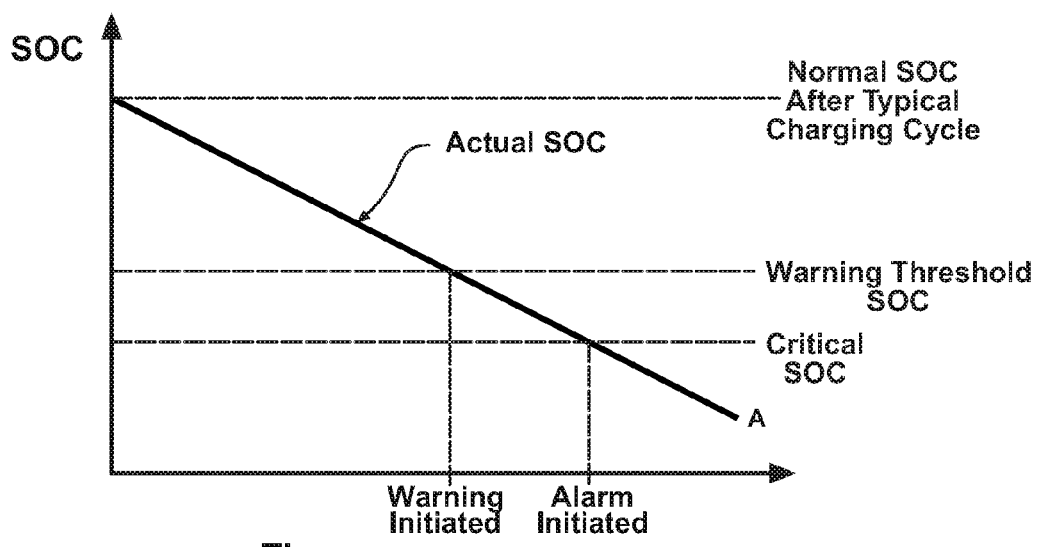
FIG. 3 is a graphical representation of state of charge versus time, illustrating a diagnostic test method related to the present disclosure.

The level of battery charge at any time during a park cycle may be sampled by measuring actual state of charge ("actual SOC") of the battery. A battery monitoring system may guard against excessive parasitic loads by comparing the actual SOC to a normal SOC after a typical charging cycle and triggering a warning for a given drop from the normal charge. Such a system is depicted in FIG. 3. Fixed thresholds are defined below the normal charge to generate first a simple warning indication and then a more serious alarm as the SOC drops to a critical SOC level. A system utilizing continuous samples of actual SOC would most accurately evaluate the on-going parasitic drain upon the battery and be able to trigger a warning as some selected threshold is passed. However, any measure of actual SOC contributes to the parasitic load upon the battery; as a result, samples of actual SOC are desirably taken at long intervals. The long intervals between actual SOC samples in such a system may allow an abnormally increased parasitic load to drain a significant amount of energy before a warning is generated. The present disclosure seeks to forecast from measurable factors within the system whether the parasitic load upon the battery is likely to put the start-up at risk by warning the operator when predicted SSOC indicates an excessive drain upon the battery.

Figure 4:
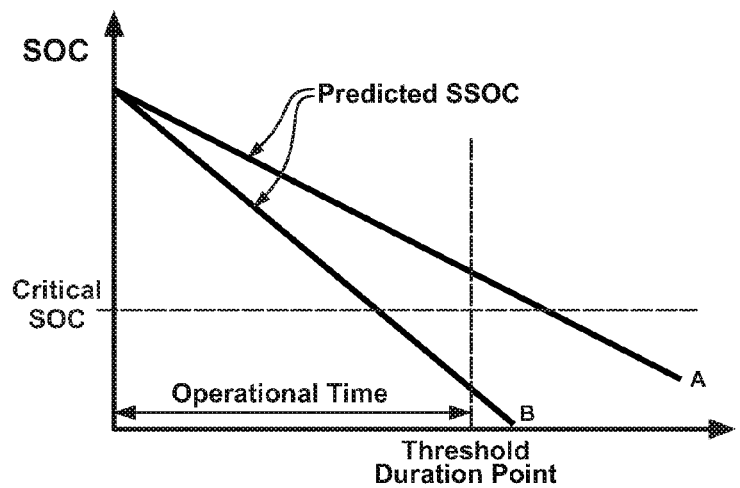
FIG. 4 is a graphical representation of exemplary state of charge and durational metrics useful in forecasting start-up state of charge in accordance with the present disclosure.

FIG. 4 graphically demonstrates the generation of a warning indication based upon a predicted SSOC in accordance with the present disclosure. Lines A and B graphically represent two alternate predicted SSOC outputs that could be generated by automatic control system 20. Line A represents a more moderate predicted drain upon the SOC, while Line B represents a more dramatic predicted drain. Batteries hold a finite level of charge, and as a result, any parasitic drain will eventually remove enough charge to comprise the ability of the battery to support a start-up event. The question becomes whether the time that the battery will take to drain is long enough to reasonably support the expectations of the operator for typical system usage. This period in which an operator may reasonably expect a battery to perform its start-up function may be called an operational time, this operational time terminating at a threshold duration point. The operational time may be a value set by the manufacturer, or it may be a value developed over time in a particular system based upon historical usage. In this embodiment, key-off time ("KT"), or a measure of time since the last key-off event, is utilized as the durational factor to generate the predicted SSOC and to define the operational time. Once a predicted SSOC is generated based upon a certain set of data inputs, state of charge prediction system 10 may compare the predicted SSOC for the given threshold KT to the critical SOC level. If the predicted SSOC level is equal to or less than the critical SOC level at the threshold KT, then a warning indication is generated or some remedial action taken to, for example, forestall battery depletion below the level required for start-up functionality. In this way, predicted SSOC may be utilized to forecast whether the battery parasitic load is such that the start-up functionality of the battery is reasonably protected through some notice and intervention.

Figure 5:
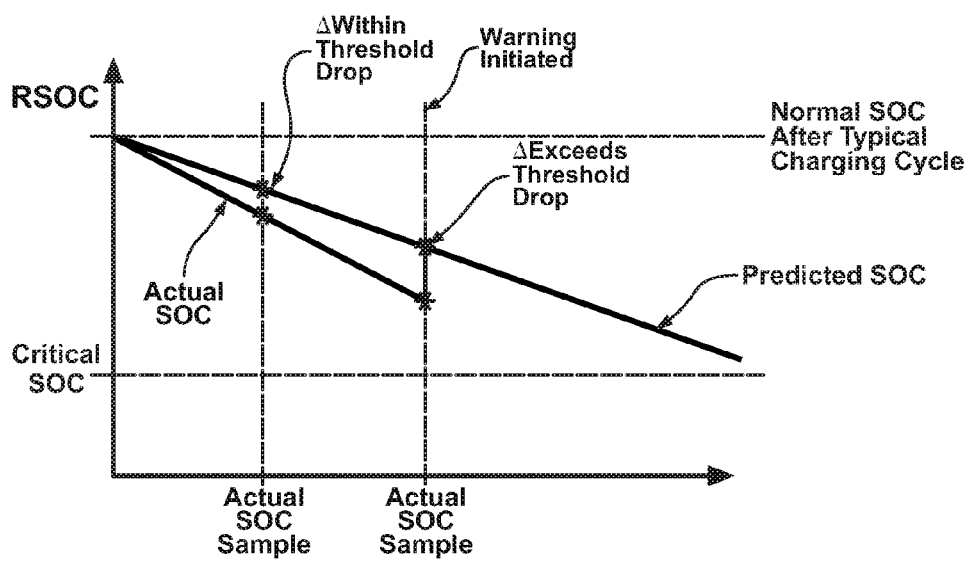
FIG. 5 is a graphical representation of exemplary state of charge and durational metrics useful in forecasting start-up state of charge in accordance with the present disclosure.

FIG. 5 graphically demonstrates an embodiment of an SOC warning indication method in accordance with the present disclosure. This embodiment may be used independently or as a complimentary method to the embodiment illustrated in FIG. 4. This embodiment contemplates the periodic measurement of an actual SOC during the park cycle. The predicted SSOC, when generated, is validated such that it is known that actual SOC values imitating the predicted SSOC curve will not require a warning. This validation can include a method such as the method outlined in FIG. 4 wherein the predicted SSOC at a threshold durational factor is compared to some threshold value, but can include any validation method. Returning to the method of FIG. 5, the actual SOC is compared to the predicted SSOC. A threshold drop from the predicted SSOC is defined, such that if the actual SOC is found to drop more than the threshold drop from the predicted SSOC for a given time reference, a warning indication is generated. The threshold drop value may be fixed or variable on the basis of the durational factor, in this particular embodiment, by KT. When used as a complimentary method to the method contemplated in FIG. 4, the predicted SSOC has previously been analyzed and determined not to forecast an excessive battery drain. The embodiment of FIG. 5 may therefore use the predicted SSOC so validated as a safe region in which the battery drain is not excessive; however, in some deviation from this safe region, the battery drain is warned to be potentially excessive. In addition, this embodiment provides a diagnostic reinforcement to the predictive method of the embodiment of FIG. 4, in that actual SOC values are checked against the predicted SSOC, and the real state of the battery is added to the analyses while still operating in a predictive manner, to warn the operator of excessive drain before the critical SOC is reached. In this way, the embodiments of FIG. 4 and FIG. 5 cooperatively predict battery parasitic drain.

As aforementioned, embodiments of the disclosure utilize data inputs relating to two properties to generate the predicted SSOC. A value quantifying a battery SOC at some given point and a durational factor describing the time span elapsed since the SOC was derived are fed to automatic control system 20. By establishing the SOC at a particular time, quantifying the passage of time, and understanding the drain per unit of time typical to a particular system, one may estimate or predict the remaining SOC at some point in the future. The means or factors used to capture these two properties may take many forms. In a preferred embodiment, testing has shown two factors highly predictive of the SOC under parasitic loads: running state of charge ("RSOC") and KT. RSOC is defined as the battery charge estimated at the end of the last running cycle before the ignition was turned off. Although RSOC and KT have shown to be especially predictive of the reaction of battery charge to parasitic loads, other alternative factors may be utilized. An estimate of battery state of health ("SOH"), a measure of the remaining lifespan or maintenance state of the battery, incorporates a measure of SOC and may be utilized as a data input. The durational factor may be described by a time dependent function, may be quantized by counting cycles of some device which periodically activates during park cycles, or may be tracked in any way that meters battery drain through a park cycle. These additional factors or others relative to the operation of a particular system capable of defining an SOC at a given time and of describing the period elapsed since that given time may be utilized separately to generate the predicted SSOC or used in conjunction with RSOC and KT to improve the accuracy of the predicted SSOC.

The rate of drain upon the battery may be affected by a multitude of particular system properties and local operating conditions. The resulting predicted SSOC is a non-linear function and may vary greatly from specific system to specific system. Different batteries may be operated under different conditions, including different climates, different parasitic loads, or different lengths of park cycles. The same basic system in which the battery belongs may be produced in several permutations and may be modified with aftermarket add-ons. The variable behavior of the battery and the system creates complexity in the predicted SSOC. Thus, a single, rigid, pre-programmed curve set in a control algorithm is not able to adapt to the conditions in specific systems. The resulting control algorithm would either give false warnings in some systems or warn too late in other systems. Instead, it is preferable that the control algorithm takes into account the typical behavior and usage of the battery in order to identify as early as possible conditions indicative of extraordinary drain upon the battery.

In order for the control algorithm to make timely and accurate assessments of the battery's condition, the control algorithm must take into account all of the variable parameters that may occur within a vehicle. While it might be possible for a technician to individually analyze and design a custom algorithm for each vehicle and periodically tune the algorithm to changing system and operating conditions, it would be unwieldy to perform such operations on a mass basis. It is instead preferable that some automatic control monitors the system and adjusts parameters of the control algorithm on the basis of the performance of the specific system. Machine learning algorithms have been developed to allow automated adjustment of functional mechanisms on the basis of changing conditions and results. A number of different machine learning algorithm techniques have become widely explored; two of particular application to the present disclosure include fuzzy logic and neural networking.

As previously discussed, FIG. 2 illustrates an embodiment of automatic control system 20 in which the algorithm is comprised of input layer 30 and mapping function 40. Either or both of these elements may incorporate machine learning algorithms in accordance with the disclosure. One embodiment, illustrated in FIG. 6, uses fuzzy logic system 34 as part of input layer 30. Another embodiment, illustrated in FIG. 7, uses a neural network 42 as part of mapping function 40. In yet another embodiment illustrated in FIG. 8, a neural network 42 is used in conjunction with fuzzy logic system 36. All of the aforementioned embodiments utilize either fuzzy logic or a neural network within automatic control system 20 in order to adaptively react to system specific variations in parasitic load upon battery charge.

Figure 6:
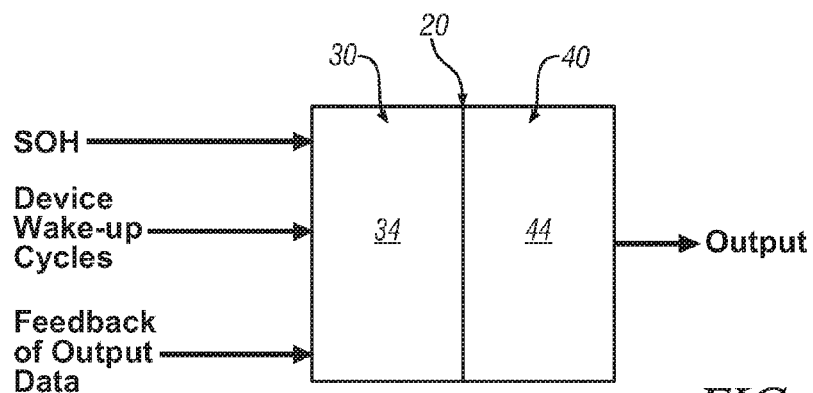
FIG. 6 is a schematic diagram illustrating an exemplary automatic control system utilizing a fuzzy logic system in accordance with an embodiment of the present disclosure.

The classification of, and reaction to, varying inputs within an input layer provide an opportunity for a control system to improve accuracy and reduce prediction errors. FIG. 6 illustrates automatic control system 20 comprising input layer 30 utilizing fuzzy logic system 34 and mapping function 40 utilizing least square function 44 in accordance with an embodiment of the present disclosure. In this particular embodiment, SOH is utilized as a data input to quantify the SOC and periodic wake-up cycles for an engine device are used to measure the durational factor. Least square function 44 is a fixed transfer function that accepts inputs from fuzzy logic system 34 to generate the predicted SSOC as an output. Fuzzy logic system 34 implements machine learning algorithm techniques to reduce prediction error in the predicted SSOC generated by least square function 44.

Complex methods of interpreting input data in computer applications have been accomplished by modeling ways in which the human mind works. When attempting to interpret a group of inputs, it is natural for the mind to group and classify the data, attempting to perceive trends, judge whether the data is within an expected pattern, and anticipate the eventual result implied by the inputs. In this way a person may treat different sets of data differently in order to achieve the most accurate results. Processing of input data by a computer is accomplished by giving the computer some means of discriminating between different values. Simple logic methods allow a computer to sort a data point by value into a classification. For example, an instruction might require if X is less than 4, then designate the data point as A; if X is greater than or equal to 4, then designate the data point as B. Fuzzy logic provides a more sophisticated means of data processing, approximating the methods utilized in the human mind, by generating fuzzy group classifications based upon patterns in actual data inputs. Output results and prediction errors are coupled to clusters of input data points used to form the fuzzy group classifications and, in this way, inputs and outputs are correlated in ways that patterns can be recognized. Additional input data sets may then be classified by these fuzzy groups as indicating probable behavior in resulting outputs. Data points falling partially between groups may be designated to belong to all groups with overlap in that area or may be designated to belong fractionally to any number of groups depending on their proximity to those groups. Depending on the membership of the input data to various fuzzy groups, probabilities or trends regarding whether the data will generate conforming or nonconforming outputs may be estimated. The process of applying grouping techniques to data inputs can be broadly referred to as extracting fuzzy rules to the inputs. In this way, fuzzy logic allows a computer to estimate likely outcomes, identify when input data falls into conforming and nonconforming groups, and to utilize multiple or partial identifications to approximate human judgment or interpretation. In this way, machine learning algorithms in the form of fuzzy logic may be applied to input layer 30 to create adaptive pre-conditioning responses to the input data. These pre-conditioning responses may be used to adjust, focus, or direct later functional operations to more closely approximate anticipated historical results.

One preferred process of initially forming the fuzzy groups is known in the art as evolving clustering method. This process may use data supplied by the manufacturer based upon test results or may be based solely on data taken from the specific system. In addition, new data processed by the fuzzy logic algorithm may be used to continue to train and adjust the groups to the specific system to which it is applied, thereby adapting the fuzzy logic algorithms to more precisely track behavior typical to the specific system. A preferred method for developing optimal data clusters for a particular system is known in the art as fuzzy-C mean.

A corollary benefit to classifying the data inputs in the fuzzy groups is that the input data may be classified by the temporal relation of data inputs to other recent data points. Put differently, fuzzy logic enables a system not only to establish average conforming behaviors of data inputs, but fuzzy logic also enable the recognition of time dependent trends in the data. Examples of time dependent trends could include the effects of seasonal temperature change over multiple park cycles or anticipating work week trends in system usage. Time dependent trends once identified could be used for a multitude of purposes, including weighting learned averages to more recent results or monitoring parasitic component trends or operator tendencies.

Figure 6A:
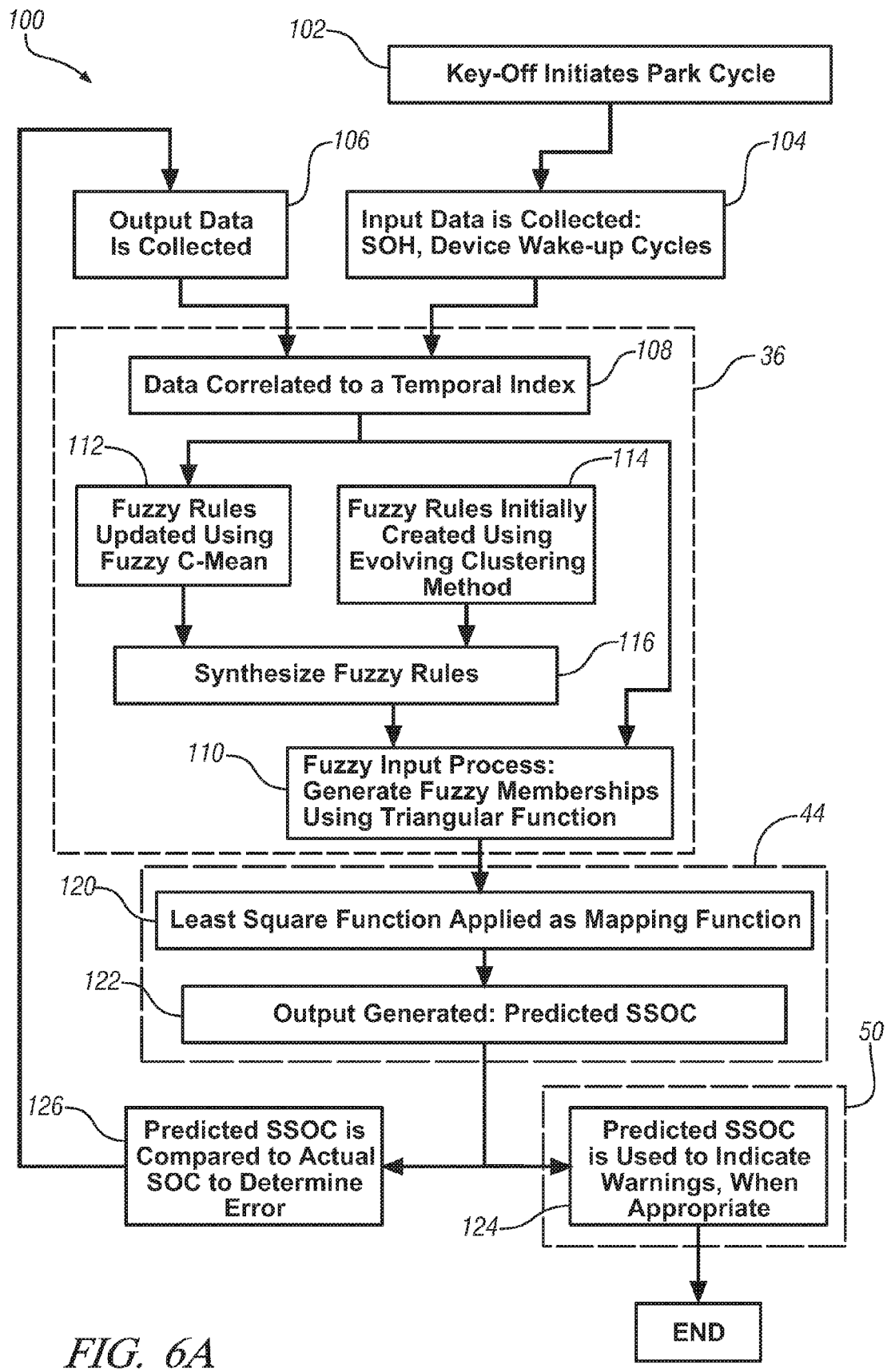
FIG. 6A is an exemplary flowchart graphically illustrating processes which may be utilized in accordance with the embodiment illustrated in FIG. 6.

FIG. 6A demonstrates an exemplary embodiment 100 of a process that may be implemented by an embodiment as pictured in FIG. 6. At step 102, the operator turns off the ignition to the system, initiating a park cycle. At step 104, input data related to battery SOH and wake-up cycles for a system device are collected as input data. Step 106 illustrates the anticipation that resulting output data feedback correlating to the current set of input data will be returned to fuzzy logic system 36 in order to be matched with the input data in relation to the learning of optimal data clusters as mentioned above. The input data collected at step 104 are sent to fuzzy logic system 36, wherein the data inputs are first correlated to a time index at step 108. The input data is fed to two locations within fuzzy logic system 36: one related to extracting fuzzy rules to the data and the other related to updating the fuzzy rules based upon the input data. Step 110 details the primary operation of fuzzy logic system 36, in which the data inputs are applied to the fuzzy input process, wherein the fuzzy rules are applied, fuzzy memberships are generated by a method known as triangular function, and the input data is pre-conditioned and sent forward to the least square function 44. The alternate destination of the input data within fuzzy logic system 36, the learning process detailed by step 112, receives the input data, the time index information applied at step 108, and the feedback of the output data from step 106 and applies updates to the fuzzy rules using the method known in the art as fuzzy C-mean. These updates, along with the initial fuzzy groups applied by step 114, are synthesized at step 116 to create and update the set of fuzzy rules applicable to future iterations of step 110. Least square function 44 receives the pre-conditioned data inputs from step 110, and applies the algorithm programmed to generate the predicted SSOC. The least square algorithm then forwards the predicted SSOC to warning indication system 50 and to step 126 in preparation to be fed back to the learning process through step 106. In step 124, warning indication system 50 analyzes the predicted SSOC by the methodology described in FIG. 4 and generates a warning to the operator indicating a threat to the next start-up cycle, where appropriate. Additionally, the predicted SSOC is compared in step 126 to an actual SOC in order to measure prediction error for the predicted SSOC. The predicted SSOC and the prediction error are fed back to step 106 so that the fuzzy rules may be updated and errors in the future might be reduced. After any appropriate warning is generated in step 124, the process is complete. An alternate embodiment whereby the method embodied in FIG. 5 and described in FIG. 7 generating a comparison to actual SOC measurements may be as validly applied to embodiments of the disclosure, but is not illustrated FIG. 6A.

Figure 7:
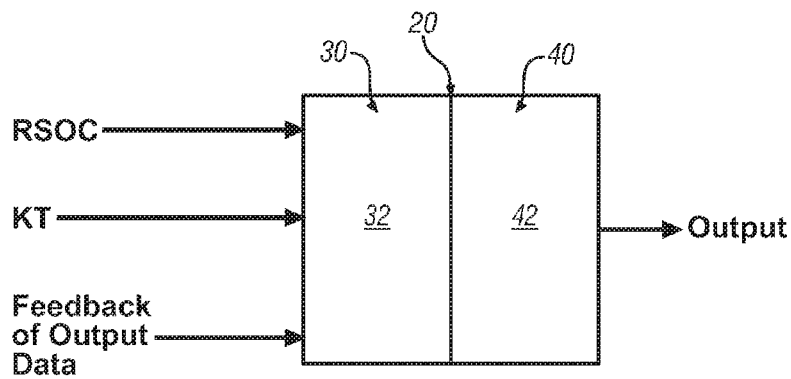
FIG. 7 is a schematic diagram illustrating an exemplary automatic control system utilizing a neural network in accordance with an embodiment of the present disclosure.

As previously mentioned, mapping function 40 may take many forms, including complex means of processing the data inputs. FIG. 7 illustrates automatic control system 20 comprising input layer 30 utilizing a simple data input layer 32 and mapping function 40 utilizing neural network 42 in accordance with an embodiment of the present disclosure. In this particular embodiment, RSOC is utilized as a data input to quantify the SOC and KT is used to measure the durational factor. Simple data input layer 32 illustrates an embodiment of input layer 30 wherein the input layer merely routes the input data and the feedback of the output data to the mapping function 40. Neural network 42 generates a predicted SSOC on the basis of the data inputs and implements machine learning algorithm techniques to iteratively adjust the functions applied to the input data in order to reduce error in the predicted SSOC over time. Neural networks provide a method for adapting a set of algorithmic functions based on changing conditions. One preferred embodiment neural network 42 is a multi-layered feed-forward neural network. The specific methodology of a multi-layered feed-forward neural network is well known and will not be discussed in detail herein. Insofar as is pertinent to the present disclosure, neural network 42 accepts data inputs from input layer 30, subjects the data inputs to weights and a bias, feeds the adjusted inputs or units to a "hidden" layer of transfer functions, subjects the transfer function outputs or units to a second set of weights and a bias, and in an output layer, feeds the units to a second set of transfer functions to generate the desired output, in this case, the predicted SSOC. Mapping function 40 utilizing neural network 42 transforms data inputs into a predicted SSOC output, and this output is adaptable over time to anomalies and behavior patterns, utilizing historical input sets and corresponding results to train the neural network, adjusting internal weights and biases to reduce future errors.

In a preferred embodiment utilizing a method known as back-propagation, neural network 42 is initially trained by inputting through the network a group of training inputs made up of a plurality of input data sets. These training inputs are developed by the manufacturer through testing of numerous similar systems to establish a baseline of expected results. As neural network 42 processes iterative sets of training inputs, the network develops or learns output values that are typical to the training inputs. Prediction errors generated by comparing outputs to the developing set of typical outputs are analyzed and fed back through neural network 42 in a learning process, in which the weights and biases are adjusted in an iterative fashion until output results statistically approach consistent or expected values. The process may stop at this point, specific systems in the field utilizing the weights and biases developed through the training set. However, in a preferred embodiment utilizing a method known as incremental learning, neural network 42 is trained to adjust network parameters to a particular battery and system by receiving individual data input sets and incrementally updating the weights and biases in a continuous iterative fashion.

Figure 7A:
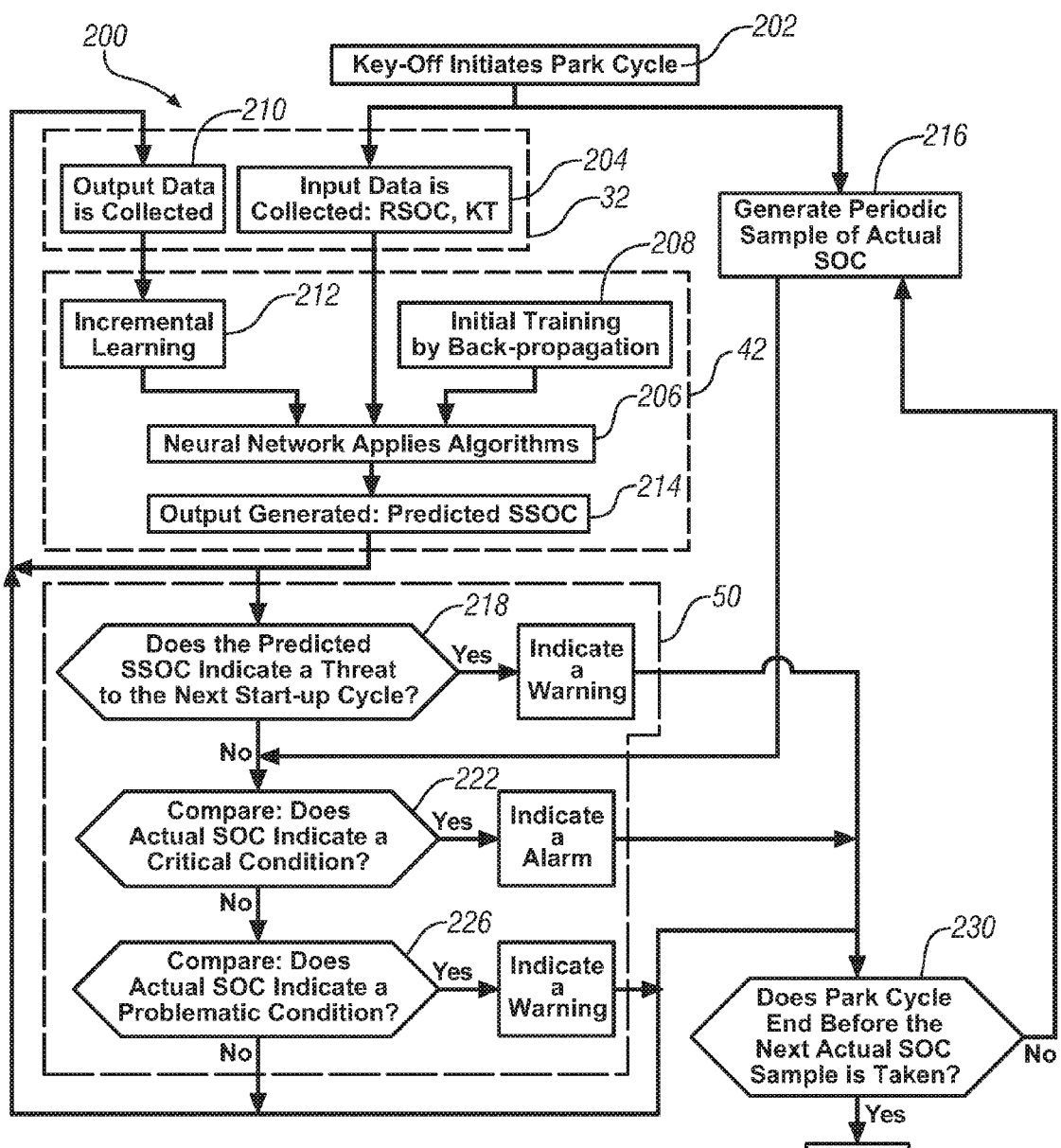
FIG. 7A is an exemplary flowchart graphically illustrating processes which may be utilized in accordance with the embodiment illustrated in FIG. 7.

FIG. 7A demonstrates an exemplary embodiment 200 of a process that may be implemented by an embodiment as pictured in FIG. 7. At step 202, the operator turns off the ignition to the system, initiating a park cycle. At step 204, input data related to RSOC and KT are collected as input data through simple data input layer 32. Additionally, output data resulting from the eventual operation of neural network 42 on the input data is fed back through the simple data input layer 32. Both the input data and the fed back output data are sent to the neural network 42. The input data is processed in step 206 by neural network 42, applying algorithms to generate the predicted SSOC. The algorithms within neural network 42 are initially trained in step 208 by back propagation and updated in step 212 in the basis of the output data, both methods described above. Neural network generates the predicted SSOC and in step 214 sends the output to warning indication system 50. In step 218, warning indication system 50 applies the methodology described in FIG. 4 to determine whether a warning is appropriate on the basis of the predicted SSOC. In the present embodiment, periodic samples of actual SOC are taken from the battery throughout the park cycle as described in step 216. If no warning is generated in step 218, the predicted SSOC is compared in step 222 to the measurement of actual SOC from step 216 to determine whether, under the methodology described in FIG. 5, a condition indicative of a severe threat to the next start-up event exists. If step 222 indicates that the SOC is likely to fall below a critical SOC before the end of the operational time, then a severe warning or alarm is generated. If step 222 does not indicate an alarm, then the predicted SSOC is again compared in step 226 to the actual SOC from step 216 to determine whether the drop in SOC, while still not indicative of a critical condition, still warrants warning the operator with a simple warning. The predicted SSOC and a prediction error resulting from the comparison to the actual SOC are fed back to step 210 wherein the output data is utilized for the incremental leaning process as described above. After steps 218, 222, and 226 and any subsequent warnings are generated, the process waits in step 230 until the next actual SOC sample is taken or the park cycle ends. If the next actual SOC sample occurs during the park cycle, then steps 222 and 226 are reiterated to reevaluate the actual SOC versus the predicted SSOC per the method of FIG. 5 and as described above.

Figure 8:
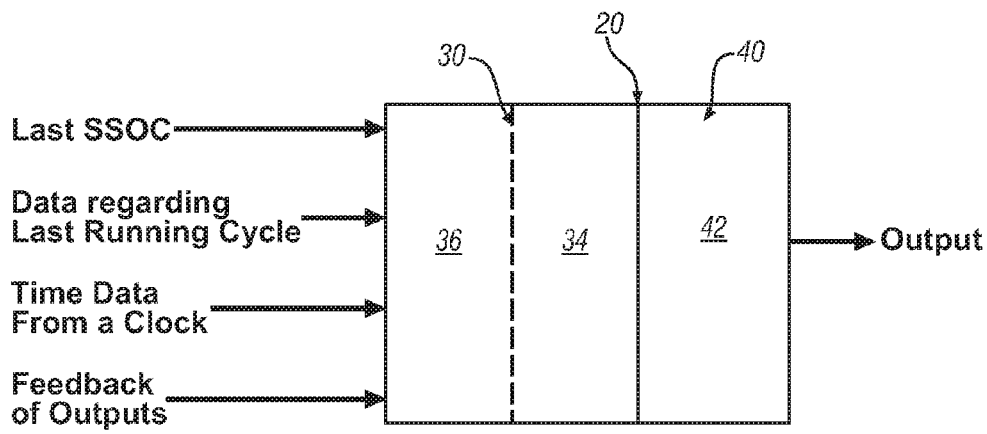
FIG. 8 is a schematic diagram illustrating an exemplary automatic control system utilizing both a neural network and a fuzzy logic system in a complimentary manner in accordance with an embodiment of the present disclosure.

In preferred embodiments of the present disclosure, neural network 42, used in conjunction with fuzzy logic system 34, receives data inputs and generates an output of predicted SSOC. FIG. 8 illustrates an automatic control system utilizing input layer 30, comprising fuzzy logic system 34 and heuristic system 36, and mapping function 40, comprising neural network 42, in a complimentary manner in accordance with an embodiment of the present disclosure. In this particular embodiment, two inputs, the start-up SOC at the last start-up event ("last SSOC") and data related to the last running cycle, are utilized together as a data input to quantify the SOC at the end of the last running cycle and time indications from a clock are used to measure the durational factor. The data inputs are sent to heuristic system 36 and are then processed by the fuzzy logic system 34, as described above. The pre-conditioned data inputs are then fed to neural network 42. This pre-conditioning from fuzzy logic system 34 may simply operate on the input data values or may operate as a separate input to be fed along with the data inputs to neural network 42 as an additional input to which the neural network may adjust. Neural network 42 then proceeds as previously described to generate the predicted SSOC.

Heuristic methods characterize data methods or algorithms that are used to get a best result from imperfect input data. Heuristic system 36 utilizes algorithms to smooth raw data or identify unreliable readings. Fuzzy logic system 34 may be used in conjunction with a heuristic system 36 to classify the plot of a current group of data input samples as a conforming group, such that a subsequent missing or incongruous data input value might be ignored or simply trigger a request to collect a new value.

Figure 8A:
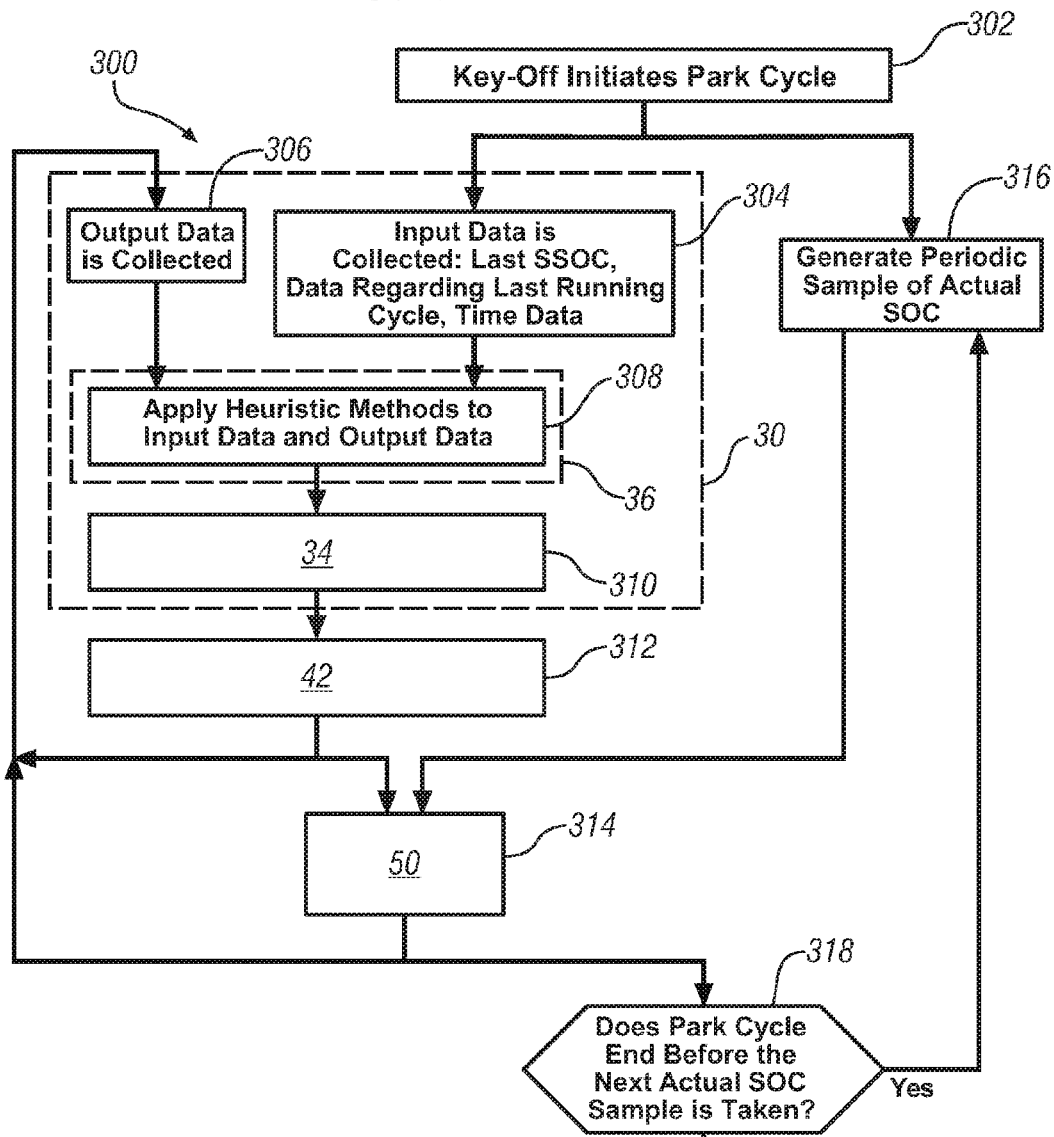
FIG. 8A is an exemplary flowchart graphically illustrating processes which may be utilized in accordance with the embodiment illustrated in FIG. 8.

FIG. 8A demonstrates an exemplary embodiment 300 of a process that may be implemented by an embodiment as pictured in FIG. 8. At step 302, the operator turns off the ignition to the system, initiating a park cycle. Steps 304 through 310 take place within input layer 30. At step 304, input data related to last SSOC, data regarding the last running cycle, and time data from a clock are collected as input data. Step 306 integrates fed back output data that is eventually generated as described in the method embodied in FIG. 7A. Data collected in steps 304 and 306 are fed to heuristic system 36, which smoothes the data, applying algorithms to diagnose or remove inconsistencies in the data. The data is then fed through steps 310 and 312 which, respectively, apply fuzzy logic and neural network principles described in FIGS. 6A and 7A in a complimentary method as described above. The resulting predicted SSOC is utilized in step 314 to generate warnings in the warning indication system as described in FIG. 7A in cooperation with actual SOC samples generated in step 316 and as previously described above. The process waits at step 318 until the next actual SOC sample is taken or the park cycle ends. If the next actual SOC sample occurs during the park cycle, then steps 316 and 314 are reiterated to reevaluate the actual SOC versus the predicted SSOC per the method of FIG. 5 and as described above.

Warnings to the operator may take many forms, including indicator lights, audible messages, output signals, or messages sent over communications networks. As mentioned above, warnings may occur in stages, serious warnings or alarms indicating a critical SOC condition and less severe simple warnings indicating a merely problematic or worse than expected SOC condition. In addition or as an alternative to the warning, the system could take actions to limit auxiliary devices and the parasitic load being taken from the battery.

In the process of monitoring and learning from the operation of the battery and system being monitored, certain trends will tend to form in the analysis that can be monitored and reported. For example, battery SOH is an important indicator that can be used to judge when a battery has aged to a point that future start-up cycles are at risk. The same fuzzy logic and neural network methodology employed to predict SSOC may be used to plot data trends and estimate battery SOH, system maintenance requirements, or other system behaviors.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method for anomaly prediction of parasitic load on a battery comprising:
   processing input data related to a state of charge for the battery and a durational factor, wherein said processing comprises a machine learning algorithm and is operative to generate a predicted start-up state of charge; and
   indicating a warning if said predicted start-up state of charge is below a threshold level within an operational time.

2. The method of claim 1, wherein said machine learning algorithm comprises fuzzy logic.

3. The method of claim 2, wherein said fuzzy logic updates on the basis of said input data, said predicted start-up state of charge, and a prediction error.

4. The method of claim 3, wherein said fuzzy logic correlates a temporal indication to said input data, such that said processing indicates temporal trends in the input data.

5. The method of claim 2, wherein said machine learning algorithm further comprises a neural network.

6. The method of claim 1, wherein said machine learning algorithm comprises a neural network.

7. The method of claim 6, wherein said neural network updates on the basis of said input data, said predicted start-up state of charge, and a prediction error.

8. The method of claim 1, wherein said input data relating to said state of charge comprises a running state of charge.

9. The method of claim 1, wherein said input data relating to said state of charge comprises a battery state of health.

10. The method of claim 1, wherein said input data relating to said durational factor comprises a key-off time.

11. The method of claim 1, wherein said threshold level is a predetermined critical level, said critical level being a calculated lowest charge that will support a start-up event.

12. The method of claim 1, wherein said threshold level is a predetermined critical level, said critical level being a predetermined measure higher than a calculated lowest charge that will support a start-up event.

13. The method of claim 1, wherein said threshold level is a threshold function based upon said durational factor.

14. The method of claim 1, further comprising:
measuring an actual state of charge of said battery;
comparing said actual state of charge to said predicted start-up state of charge; and
initiating a warning if said comparison indicates that said actual state of charge has dropped more than a threshold drop below said predicted start-up state of charge.

15. The method of claim 1, wherein said warning comprises an alert by means of a communications network.

16. The method of claim 1, wherein said warning comprises reduced functionality of devices utilizing said battery.

17. The method of claim 1, wherein said processing further comprises heuristic techniques for the purpose of overcoming inconsistencies in said input data.

18. The method of claim 1, wherein said processing further comprises trend analysis whereby a battery state of health for said battery is developed.

19. A method for anomaly prediction of parasitic load on a battery in a motor vehicle comprising:
receiving input data related to a running state of charge for the battery and a key-off time;
processing said input data to create a predicted start-up state of charge for said battery, wherein said processing comprises a machine learning algorithm; and
initiating a warning if said predicted start-up state of charge is below a threshold level before a threshold time.

20. The method of claim 19, wherein said machine learning algorithm comprises fuzzy logic operable to analyze and identify said input data into a plurality of fuzzy groups indicating a degree to which said input data conforms to historical input data sets, said historical input data sets being correlated to resulting prediction errors.

21. The method of claim 20, wherein said machine learning algorithm comprises a layered feed-forward neural network operative to adapt to multiple iterations of said input data and related prediction errors.

* * * * *